(12) United States Patent
Eguchi et al.

(10) Patent No.: US 6,226,200 B1
(45) Date of Patent: May 1, 2001

(54) IN-CIRCUIT MEMORY ARRAY BIT CELL THRESHOLD VOLTAGE DISTRIBUTION MEASUREMENT

(75) Inventors: Richard Kazuki Eguchi; David William Chrudimsky; Thomas Jew, all of Austin, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/441,865

(22) Filed: Nov. 17, 1999

(51) Int. Cl.[7] .................................................. G11C 16/04
(52) U.S. Cl. ............................... 365/185.19; 365/185.22; 365/226
(58) Field of Search .................... 365/185.18, 185.19, 365/185.29, 185.3, 185.33, 185.22, 226

(56) References Cited

U.S. PATENT DOCUMENTS

| | | | |
|---|---|---|---|
| 4,528,505 | 7/1985 | Peterson | 324/158 R |
| 4,922,184 | 5/1990 | Rosenstein et al. | 324/72.5 |
| 5,039,941 | 8/1991 | Castro | 324/158 T |
| 5,142,496 | 8/1992 | Van Buskirk | 365/201 |
| 5,253,206 | 10/1993 | Tanaka et al. | 365/189.09 |
| 5,315,167 * | 5/1994 | Chan et al. | 307/296.6 |
| 5,371,712 | 12/1994 | Oguchi et al. | 365/230.06 |
| 5,420,822 | 5/1995 | Kato et al. | 365/218 |
| 5,553,021 * | 9/1996 | Kubono et al. | 365/185.33 |
| 5,566,110 | 10/1996 | Soenen et al. | 365/185.07 |
| 5,576,994 | 11/1996 | Kato et al. | 365/185.3 |
| 5,625,591 | 4/1997 | Kato et al. | 365/185.24 |
| 5,636,168 | 6/1997 | Oyama | 365/201 |
| 5,732,022 | 3/1998 | Kato et al. | 365/185.24 |
| 5,757,816 | 5/1998 | Al-Assadi et al. | 371/21.1 |
| 5,835,429 | 11/1998 | Schwartz | 365/201 |
| 5,867,719 * | 2/1999 | Harris, II et al. | 365/201 |
| 5,901,103 * | 5/1999 | Harris, II et al. | 365/226 |
| 6,091,642 * | 7/2000 | Pasotti et al. | 365/185.29 |

* cited by examiner

Primary Examiner—Richard Elms
Assistant Examiner—VanThu Nguyen
(74) Attorney, Agent, or Firm—James L. Clingan, Jr.; M. Kathryn Braquet Tsirigotis

(57) ABSTRACT

An apparatus and method for operating a non-volatile memory including an array of bit cells. A selection is made between an operational power supply and a test power supply, the test power supply being on-chip programmable. The non-volatile memory is operated in a operational mode if the operational power supply is selected, and in a test mode if the test power supply is selected.

24 Claims, 5 Drawing Sheets

IN-CIRCUIT MEMORY ARRAY BIT CELL THRESHOLD VOLTAGE DISTRIBUTION MEASUREMENT

BACKGROUND OF THE INVENTION

1. Field of the Invention

The present invention relates to non-volatile memory systems and, more particularly, to a memory system including an in-circuit or on-chip technique to measure threshold voltages of bit cells in the non-volatile memory system.

2. Description of the Related Art

Measurement of threshold voltages of bit cells in NVM systems has typically included using external production test platforms and, for example, measuring the current/voltage characteristics of bit cells in flash memory by sweeping an input voltage and measuring bit cell voltage on a pin. Another method for measurement of threshold voltages of bit cells in NVM systems includes using external production test platforms and, for example, measuring the current/voltage characteristics of bit cells and comparing the bit cell current/voltage characteristics against an internal reference by sweeping an input voltage and reading a digital data output. A disadvantage of both prior methods is that the test platform must be able to sweep a precisely controlled input voltage and, in the case of the first method, measure small bit cell currents.

Typical measurement of current Flash EEPROM array threshold voltage distributions require complicated external voltage and timing control to collect using existing production test platforms. For example, existing production test platforms require synchronization of devices under test, complex control codes, and intelligent test platforms, resulting in long test times and are not suitable for highly parallelized test environments due to the high pin count of the devices under test. Also, in existing production test platforms high precision power supplies are required. Other issues to consider in testing microcontrollers with embedded non-volatile memory (NVM) on a single site tester include decrease data retention and worse gate/drain stress results after program/erase cycling and identification of latent program/erase endurance failures for parts with high endurance specifications.

Conventional testing of microcontrollers with embedded NVM on a single site tester has shown that up to 90% of the total test cost is used just on the flash module. With embedded NVM memory sizes reaching 500 Kbyte and even 1 Mbyte, better and more cost effective methods are needed to test the flash in order to decrease cycle time and reduce costs, while maintaining quality and reliability.

The present invention provides an on-chip digitally controllable precision voltage source to sweep the control gates of the array of bit cells and compare the bit cell current/voltage characteristics against an internal reference. The present invention is self-contained and suitable for self test in highly parallel environments and improves the throughput by eliminating the overhead of the platform tester/device under test handshaking.

SUMMARY OF THE INVENTION

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

According to the present invention, an apparatus and method are described for operating a non-volatile memory including an array of bit cells. A selection is made between an operational power supply and a test power supply, the test power supply being on-chip programmable. The non-volatile memory is operated in a operational mode if the operational power supply is selected, and in a test mode if the test power supply is selected.

In a first embodiment of the present invention, the non-volatile memory is operated in the test mode and a threshold voltage distribution in the non-volatile memory is measured over a range of voltage values from a first voltage value to a last voltage value. In another embodiment of the present invention operating the non-volatile memory in the test mode includes early detection of an imminent failure of the non-volatile memory. In still another embodiment of the present invention operating the non-volatile memory in the test mode includes stress testing the non-volatile memory A further understanding of the nature and advantages of the present invention may be realized by reference to the remaining portions of the specification and the drawings.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

Features appearing in multiple figures with the same reference numeral are the same unless otherwise indicated.

DETAILED DESCRIPTION [OF THE PREFERRED EMBODIMENTS]

The following is intended to provide a detailed description of an example of the invention and should not be taken to be limiting of the invention itself. Rather, any number of variations may fall within the scope of the invention which is defined in the claims following the description.

Figure 1:
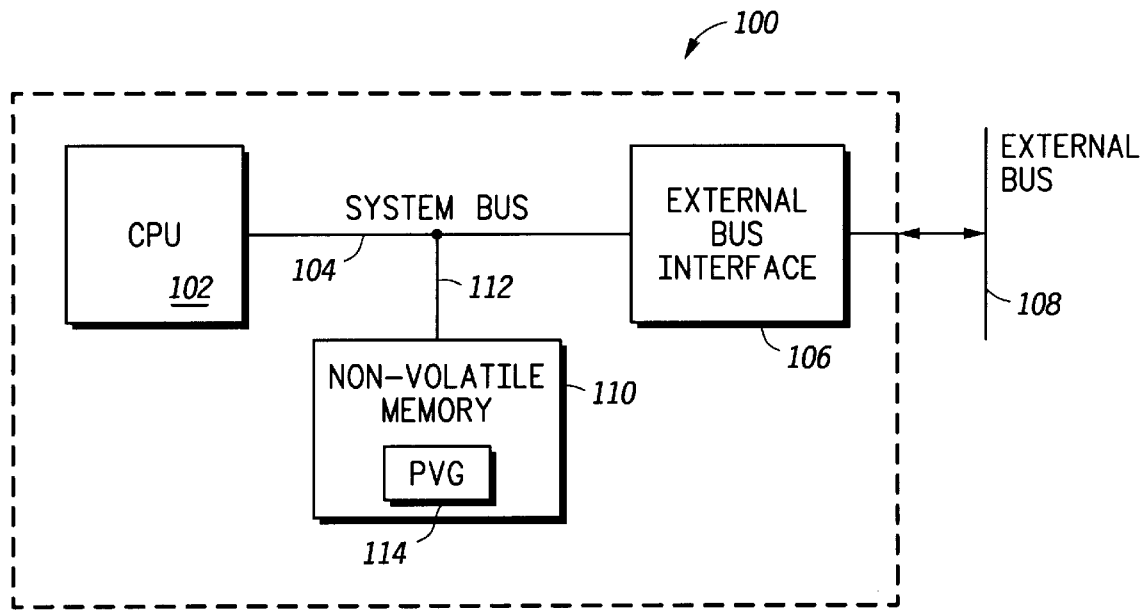
FIG. 1 is a functional block diagram of a microcontroller including an embedded non-volatile memory module.

FIG. 1 is a functional block diagram of a microcontroller 100 including an embedded non-volatile memory (NVM) 110 module, the NVM 110 module further including an on-chip programmable voltage generator (PVG) 114. The microcontroller 100 further includes a central processing unit (CPU) 102 connected to the NVM 110 module through a system bus 104. An external bus interface 106 is connected to the NVM 110 and CPU 102 through the system bus 104 and is utilized to connect external devices such as, for example, I/O devices (not shown) through an external bus 108.

The foregoing components and devices are used herein as examples for sake of conceptual clarity. As, for examples, CPU 102 is utilized as an exemplar of any general processing unit, including but not limited to multiprocessor units; system bus 104 and external bus 108 are utilized as exemplars of any processing bus, including but not limited to multiprocessor buses and I/O buses; and external bus interface 106 is utilized as an exemplar of any type of interface which is utilized for interfacing with an external bus. Consequently, as used herein these specific exemplars are intended to be representative of their more general classes. Furthermore, in general, use of any specific exemplar herein is also intended to be representative of its class and the non-inclusion of such specific devices in the foregoing list should not be taken as indicating that limitation is desired.

Figure 2:
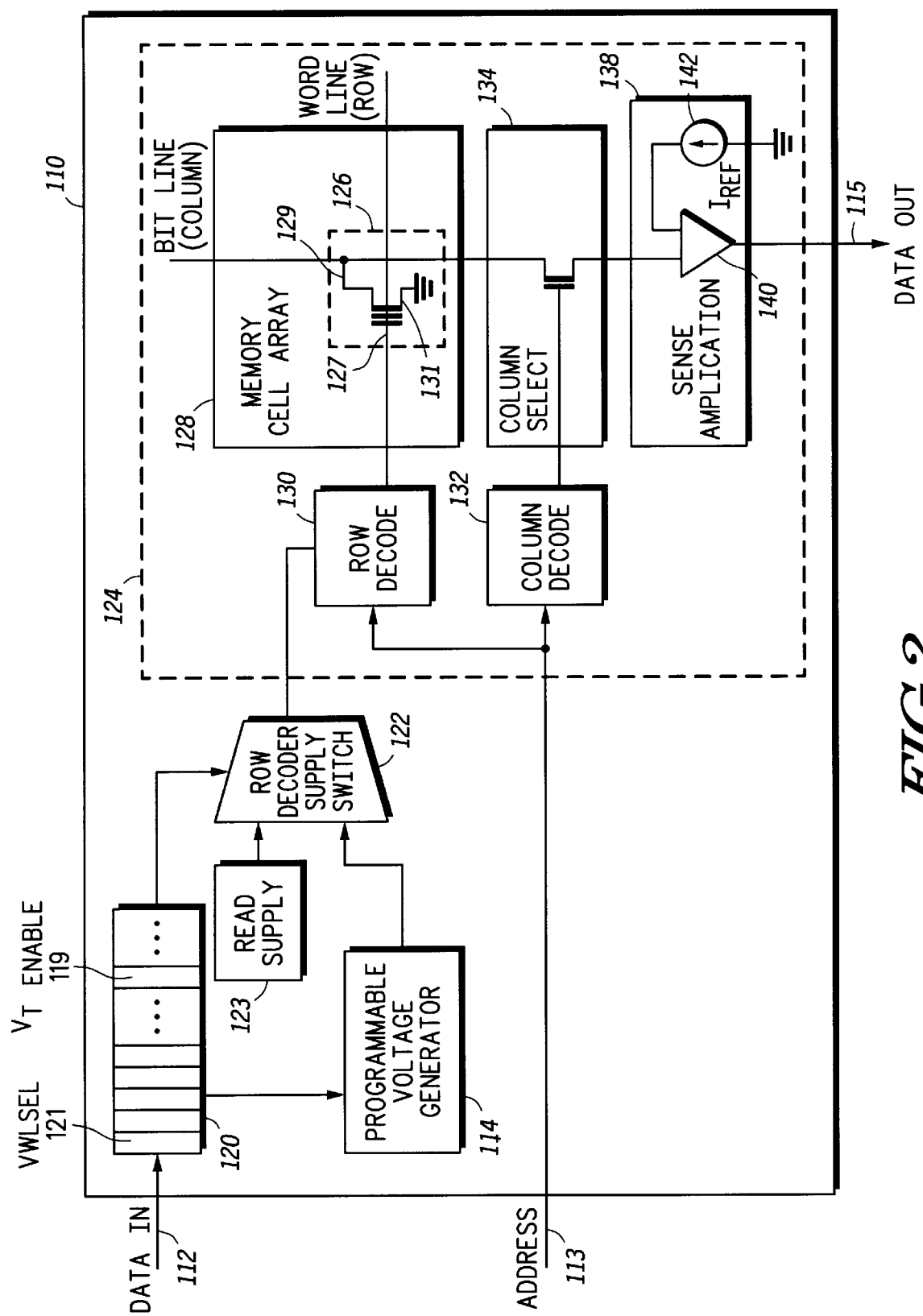
FIG. 2 is a functional block diagram of a non-volatile memory module according to the present invention.

FIG. 2 is a functional block diagram of the NVM 110 module according to the present invention. The NVM 110 module may be embedded in the microcontroller 100 as illustrated in FIG. 1 or may be a stand alone memory module. The core of the NVM 110 is an array 128 of memory cells or bit cells, for example, a bit cell 126. The array 128 is preferably a floating gate transistor cell array wherein each bit cell 126 contains a floating gate transistor with a control gate terminal 127 connected to a word line and a drain terminal 129 connected a bit line and a source terminal 131 to a ground. The individual bit cells 126 in the array 128 are arranged in rows and columns, with there being, for example, a total 128K thirty-two bit words stored in the array 128. The row decoder 130 decodes addresses input from an address line 113 to select the row in the array 128 in which the desired memory bit cell 126 is located. The column decoder 132 decodes addresses input from the address line 113 and enables the column select 134 to select the column in the array 128 in which the desired memory bit cell 126 is located. The column select 134 connects the bit cell 126 to a sense amplifier module 138 including a plurality of sense amplifiers, for example, a sense amplifier 140. The sense amplifier 140 is used to read the data contained in a memory bit cell during a read operation or during a data verification step in which the state of a bit cell is determined after, for example, a programming or erase operation. For example, the sense amplifier 140 determines the data contained in the bit cell 126, which includes a bit cell 126 current value, by comparing the current value of the bit cell 126 to a current reference 142. If the bit cell 126 current is greater than the current reference 142 then the sense amplifier 140 reads the bit cell 126 as a logical value of one at a data out line 115. If the bit cell 126 current is less than the current reference 142 then the sense amplifier 140 reads the bit cell 126 as a logical value of zero at the data out line 115.

Programming or erasing of the memory cells in array 128 is carried out by applying the appropriate voltages to the source, drain and control gate of a cell for an appropriate time period. This causes electrons to tunnel or be injected from a channel region to a floating gate. The amount of charge residing on a floating gate determined the voltage required on the control gate in order to cause the device to conduct current between the source and drain regions. This is termed the threshold voltage or $V_T$ of the bit cell. Conduction represents an "on" or erased state of the device and corresponds to a logic value of one. An "off" or programmed state is one in which current is not conducted between the source and drain regions and corresponds to a logic value of zero. By setting the $V_T$ of the bit cell to an appropriate value, the bit cell can be made to either conduct or not conduct current for a given set of applied voltages. Thus, by determining whether a bit cell conducts current at a given set of applied voltages, the state of the bit cell (programmed or erased) can be found.

The NVM 110 module verifies the status of the bit cells in the array 128 after performing programming or erasing operations on the bit cells. Verification occurs by accessing each bit cell and evaluating the margins (the voltage differential between the $V_T$ of a bit cell and ground level) that the bit cell has after the operation.

The NVM 110 module includes a control register 120, a row decoder supply switch 122, an operational read supply 123, and the programmable voltage generator (PVG) 114. The PVG 114 includes, for example, a voltage divider. According to the present invention, the PVG 14, or test power supply, is on-chip, or in-circuit, programmable using the control register 120. A data in line 112 provides the control register 120 input values. The control register 120, includes various bit fields to control the word line supply voltage used during read operation of the memory array 128. For example, one bit field, a $V_T$ enable field 119, is used to enable the row decoder supply switch 122 to select an output from the read supply 123 or the PVG 114. The output from the row decoder supply switch 122 is the power supply for the row decoder 130. The power supply from the row decoder supply switch 122 to the row decoder 130 is the voltage driven onto the selected word line.

The method of operating a non-volatile memory according to the present invention includes selecting between an operational power supply and a test power supply, wherein the test power supply is on-chip programmable. The non-volatile memory operates in an operational mode if the operational power supply node is selected and in a test mode if the test power supply is selected. For example, in normal read operations the $V_T$ enable field 119 selects the read supply 123 voltage output, or operational power supply, to be used as the row decode 130 supply voltage. In test mode operations the $V_T$ enable field 119 selects the PVG 114 voltage output, or test power supply, to be used as the row decode 130 supply voltage.

Another bit field, for example, a word line voltage ($V_{WL}$) select field 121, is used to select the output voltage of the programmable voltage generator 114. By changing the $V_{WL}$ select field 121, the output voltage of the programmable voltage generator 114 is changed. In test mode operations, as the output voltage of the programmable voltage generator 114 is changed, the voltage supplied to the bit cell 126 control gate terminal 127 is also changed.

Figure 3:
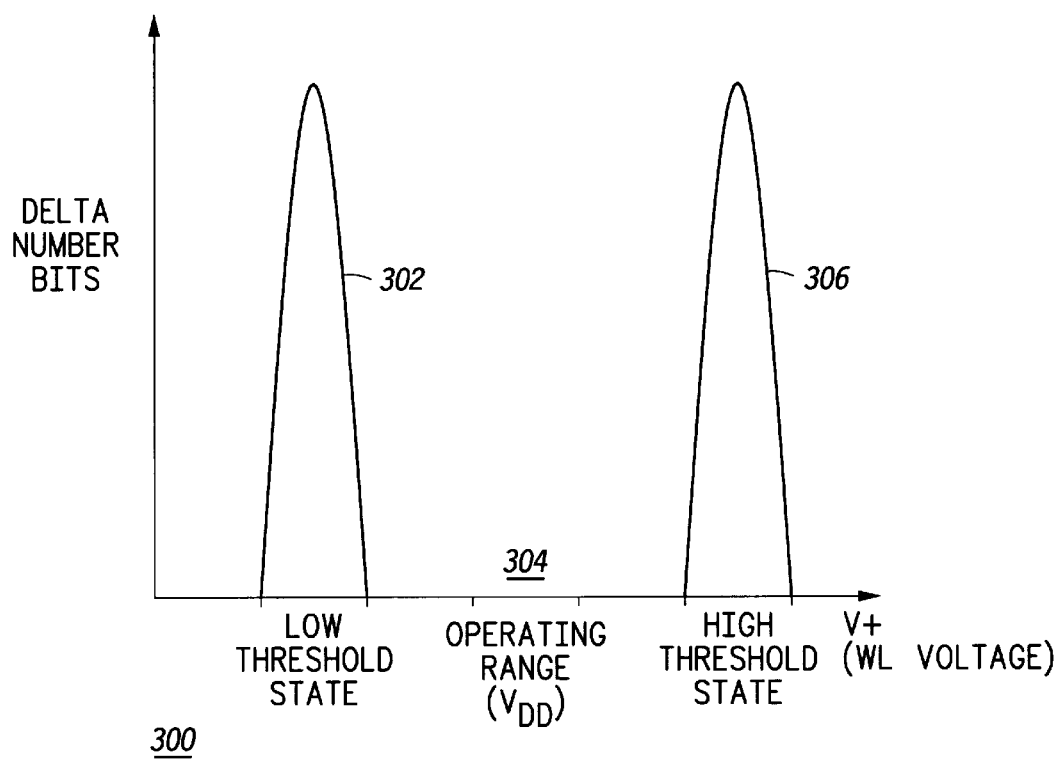
FIG. 3 is a diagram showing the distribution of the bit cells' threshold voltages ($V_T$) with respect to word line voltages.

FIG. 3 is a diagram showing the desired distribution curves 300 of the bit cells' $V_T$ with respect to word line voltages. The operating range 304 is the voltage that is applied to the bit cell control gate 127 during normal read operations. Bit cells in the high threshold state or programmed state reside in the distribution of curve 306, and bit cells in the low threshold state or erased state reside in the distribution of curve 302. The minimum of the high threshold state is separated from a maximum of an operating range 304 to insure reliable reads of bit cells in the high threshold state. The maximum of the low threshold state is separated from a minimum of the operating range 304 to insure reliable reads of bit cells in the low threshold state.

Figure 4:
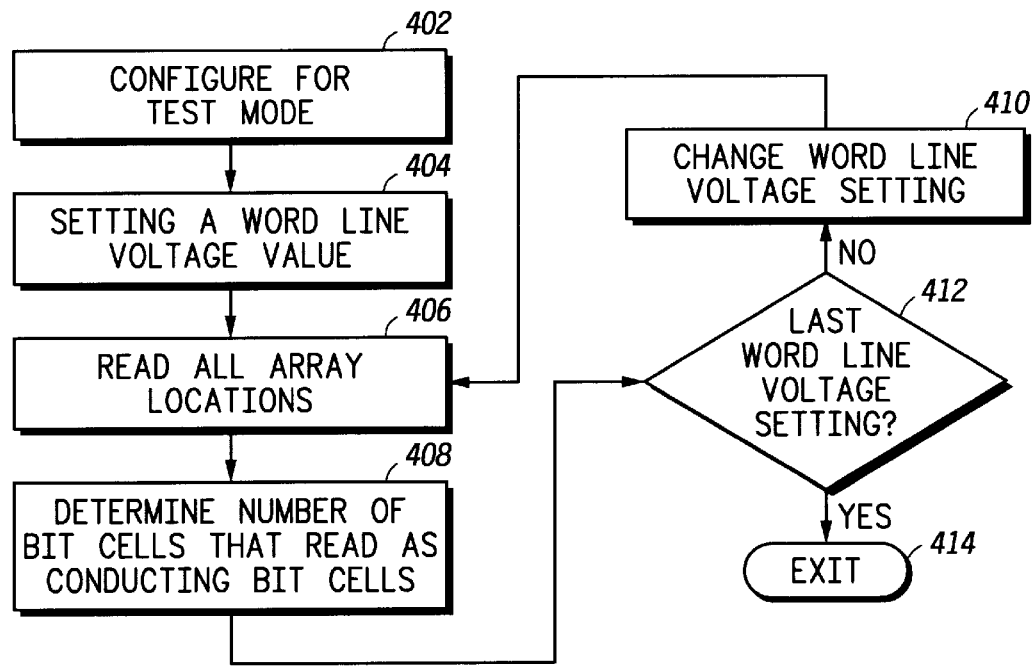
FIG. 4 is a flow chart showing the method according to the present invention for determining the $V_T$ distribution of bit cells in a memory array.

FIG. 4 is a flow chart showing the method according to one embodiment of the present invention for determining the $V_T$ distribution of bit cells in the memory array, wherein the non-volatile memory 110 is operating in the test mode, and the $V_T$ distribution is measured over a range of voltage values from, for example, a first voltage value to a last voltage value. At block 402, the NVM 110 is configured for a test mode including applying the test power supply, illustrated as the PVG 114 in FIG. 2, to the NVM 110 wherein the NVM operates in a test mode. At block 404, the word line voltage is set to the first voltage value. All of the bit cell locations in the memory cell array 128 are then read at block 406. At block 408 a determination is made as to which bit cells are conducting and the number of bit cells that read as conducting bit cells. At decision block 412, a determination is made as to whether the word line voltage is set at the last voltage value. If the word line voltage is not yet at the last voltage value the flow continues to block 410 wherein the word line voltage setting is changed by a fraction of a value of the test power supply in the direction of the last voltage value. In the array of bit cells in the NVM 110 is again read at block 406. At block 408 the number of bit cells that read as conducting bit cells are then determined and the process is repeated until at block 412 it is determined that the word line voltage is set at the last voltage value wherein the process exits at 414. By successively reading and changing the word line voltage and determining the bit cells that are conducting, or where the data out 115 changes state, the $V_T$ of each bit cell can be determined at that point where the data out 115 changes state and hence the distribution of $V_T$ of the bit cells in the memory array 128 can be determined. The method for determining the distribution of $V_T$ of the bit cells can also be applied to gang testing multiple devices on a wafer using the on-chip programmable circuitry of the present invention.

At block 404, setting the word line voltage to the first voltage value further includes programming the control register 120 with a first digital value indicative of the first voltage value. At block 410, changing the word line voltage also further includes changing the control register 120 to a next digital value, which can include incrementing a field of the control register 120 or decrementing a field of the control register 120. At block 408, determining whether the bit cells are conducting further includes determining which bit cells read as conducting and storing the word line voltage value at which the bit cell first conducts, or the change in state, for each bit cell which reads as conductive.

Figure 5:
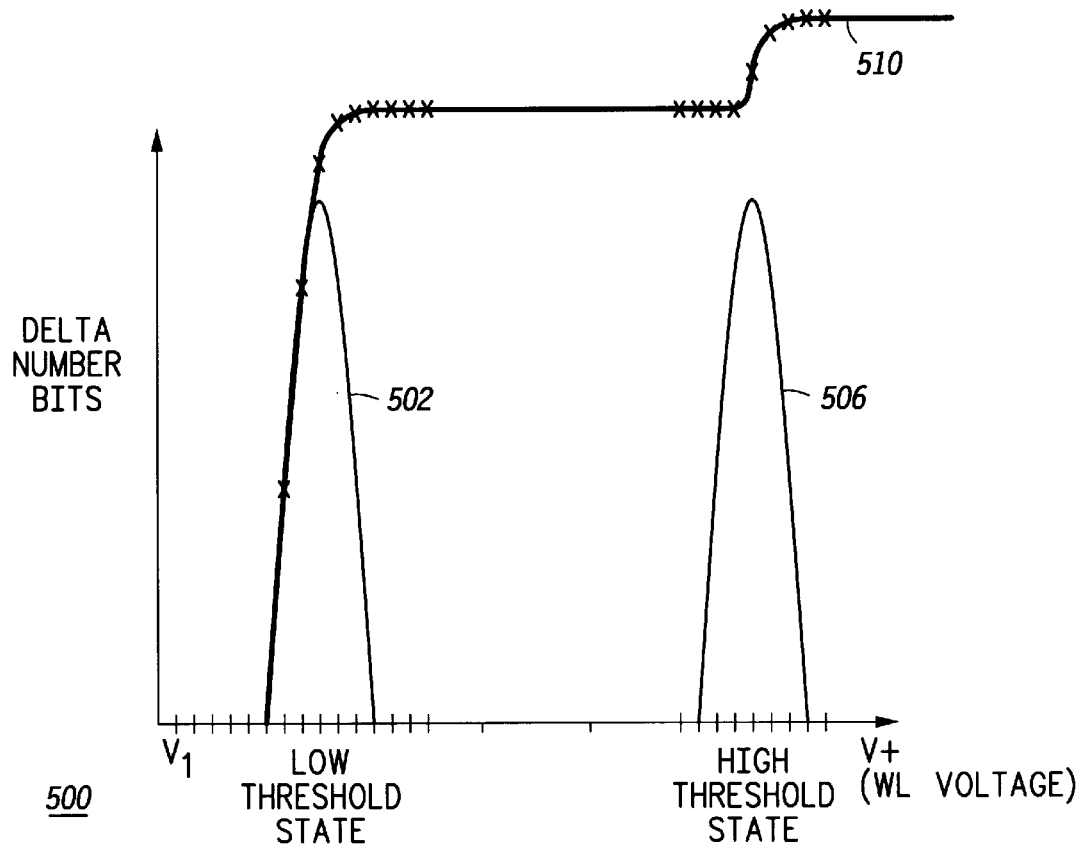
FIG. 5 is a diagram showing the distribution of the bit cells' threshold voltages ($V_T$) with respect to word line voltages and a cumulative $V_T$ distribution.

FIG. 5 is a diagram showing the distribution of the bit cells $V_T$ with respect to word line voltages and accumulative $V_T$ distribution. Bit cells in the high threshold state, or programmed state, reside in the distribution of curve 506 and bit cells in the low threshold state, or erased state, reside in the distribution of curve 502. Curve 510 is the cumulative number of bit cells exceeding the $V_T$ levels indicated by tic marks.

Figure 6:
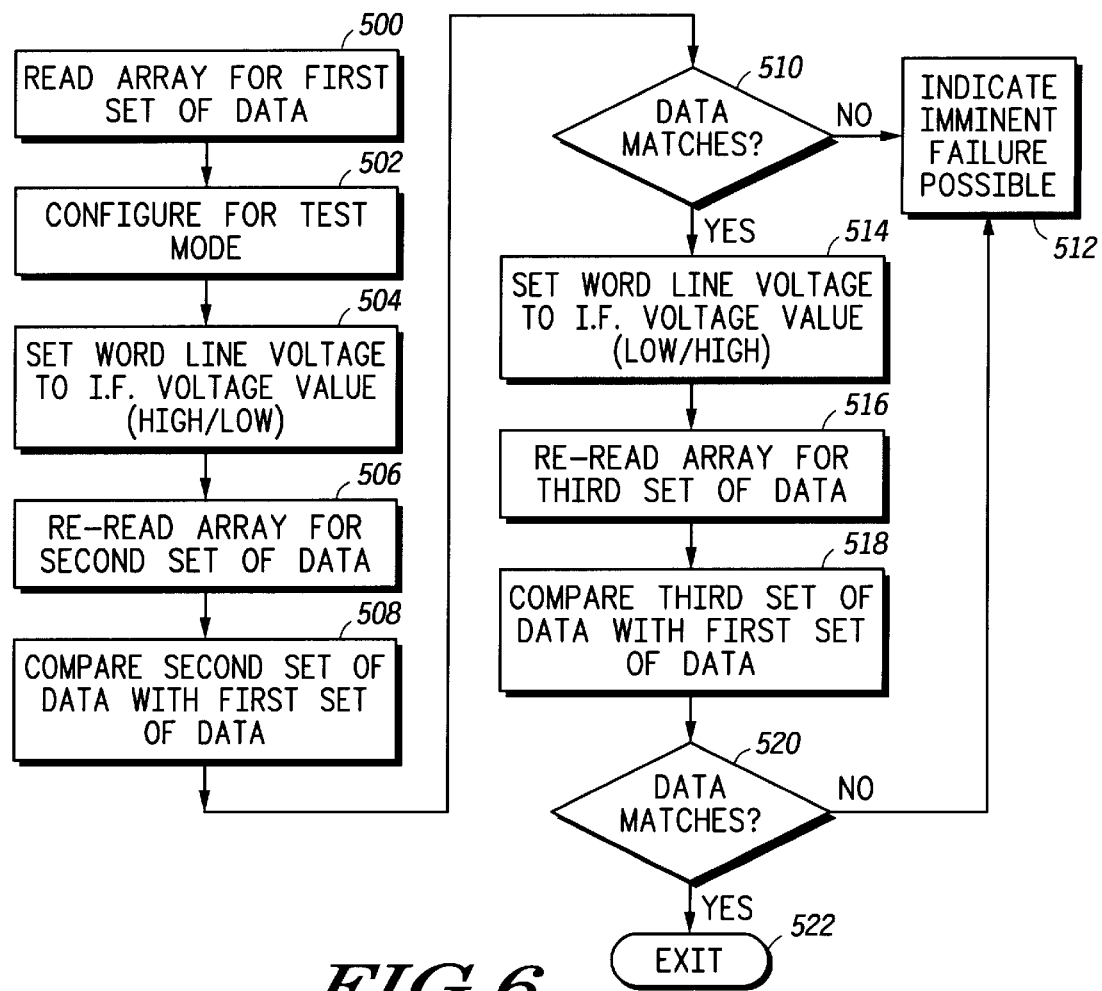
FIG. 6 is a flow chart showing the method according to the present invention for detection of imminent failures.

FIG. 6 is a flow chart showing the method according to another embodiment of the present invention for the detection of imminent failures. One advantage of the present invention is that imminent failures of a memory cell array can be detected early, for example, by a customer, without the use of external test platforms. The non-volatile memory integrated circuit and method of operation according to the present invention is suitable for self test in highly parallel environments and provides for early imminent failure detection. FIG. 6 illustrates an embodiment wherein, in the test mode, imminent failure of the NVM 110 is detected. The operational power supply, illustrated as the read supply 123, is selected and applied to the NVM 110 and, at block 500, a first set of data is read from the array of bit cells after applying the operational power supply to the NVM 110. At block 502 the test mode is configured for the NVM 110 including selecting and applying the test power supply to the NVM 110. At block 504 the word line voltage is set to an imminent failure voltage value and then, at block 506, the array of bit cells is re-read giving a second set of data from the array of bit cells. At block 508 the first set of data is compared to the second set of data. A decision is made at decision block 510 to determine if an imminent failure is indicated based on the comparison of the first set of data to the second set of data, for example, indicating an imminent failure possible at block 512 if the comparison of the first set of data and the second set of data shows that the data does not match.

If the first set of data and second set of data do match, an imminent failure is not indicated. If the imminent failure voltage value set at block 504 was a high voltage value then at block 514 the word line voltage is set to an imminent failure low voltage value. If, however, the imminent failure voltage value set at block 504 is an imminent failure low voltage value, then the imminent failure voltage value set at block 514 will be a high voltage value. At block 516 a third set of data is read from the array of bit cells. At block 518 the first set of data is compared to the third set of data to determine, at decision block 520, if an imminent failure is indicated based on the comparison of the first set of data to the third set of data. If, at decision block 520, the first set of data and the third set of data do not match then a possible imminent failure is indicated at block 512. If, however, at decision block 520 the first set of data and the third set of data do match then the process exits at block 522. The first set of data, the second set of data and the third set of data may include, first values read from the array of bit cells after applying the operational power supply to the NVM 110, second values read from the array of bit cells after setting the word line voltage to the imminent failure voltage value, and third values read from the array of bit cells after setting the word line voltage to the imminent failure voltage value, respectively. The first set of data, the second set of data and the third set of data may also include a checksum of the first values, a checksum of the second values, and a checksum of the third values, respectfully.

Figure 7:
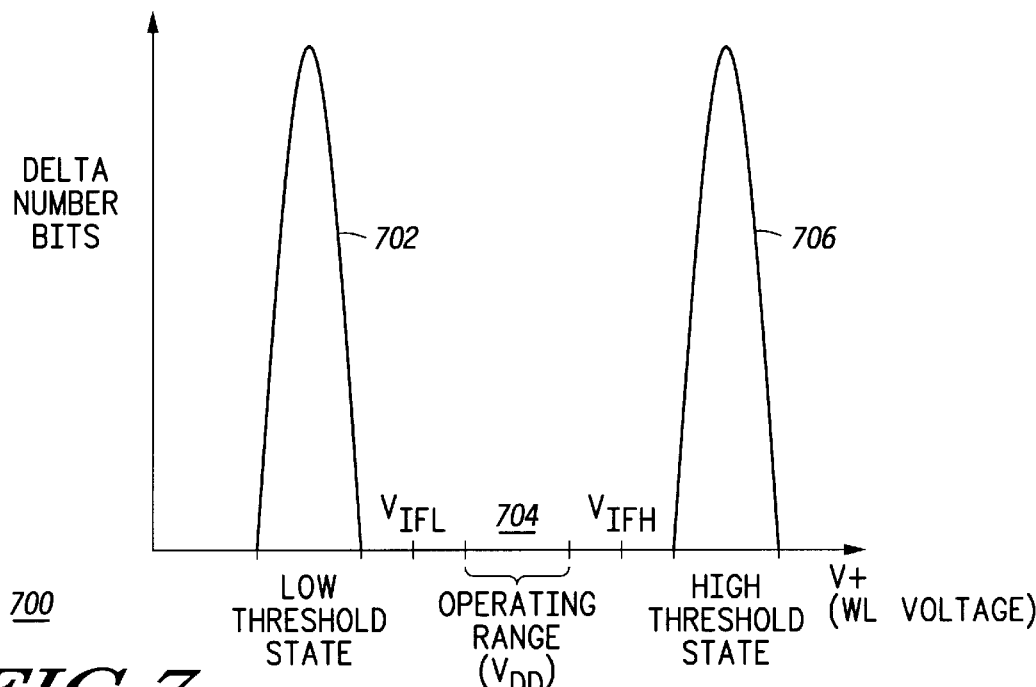
FIG. 7 is a diagram showing the distribution of the bit cells' $V_T$ with respect to word line voltages and indicating both the operating range and the detection thresholds.

FIG. 7 is a diagram showing the distribution of the bit cells $V_T$ with respect to word line voltages and indicating both the operating range and the detection thresholds. The operating range 704 is the voltage that is applied to the bit cell control gate 127 during normal operations. Bit cells in the high threshold state, or programmed state, reside in the distribution of curve 706, and bit cells in the low threshold state, or erased state, reside in the distribution of curve 702. The imminent failure low voltage value is indicated as $V_{IFL}$ and the imminent failure high voltage value is indicated as $V_{IFH}$. The closer the imminent failure voltage, either the high voltage or the low voltage, is to the operating range 704 the less time allowed to react to imminent failure possibilities. Conversely the further away the imminent failure voltage is to the operating range 704 the greater the amount of time allowed to react to an imminent failure possibility. The range allowable for $V_{IFL}$ is from the maximum of the low threshold state 702 to the minimum of operating range of 704, and the range allowable for $V_{IFH}$ is the minimum of the high threshold state 706 to the maximum of the operating range 704.

Figure 8:
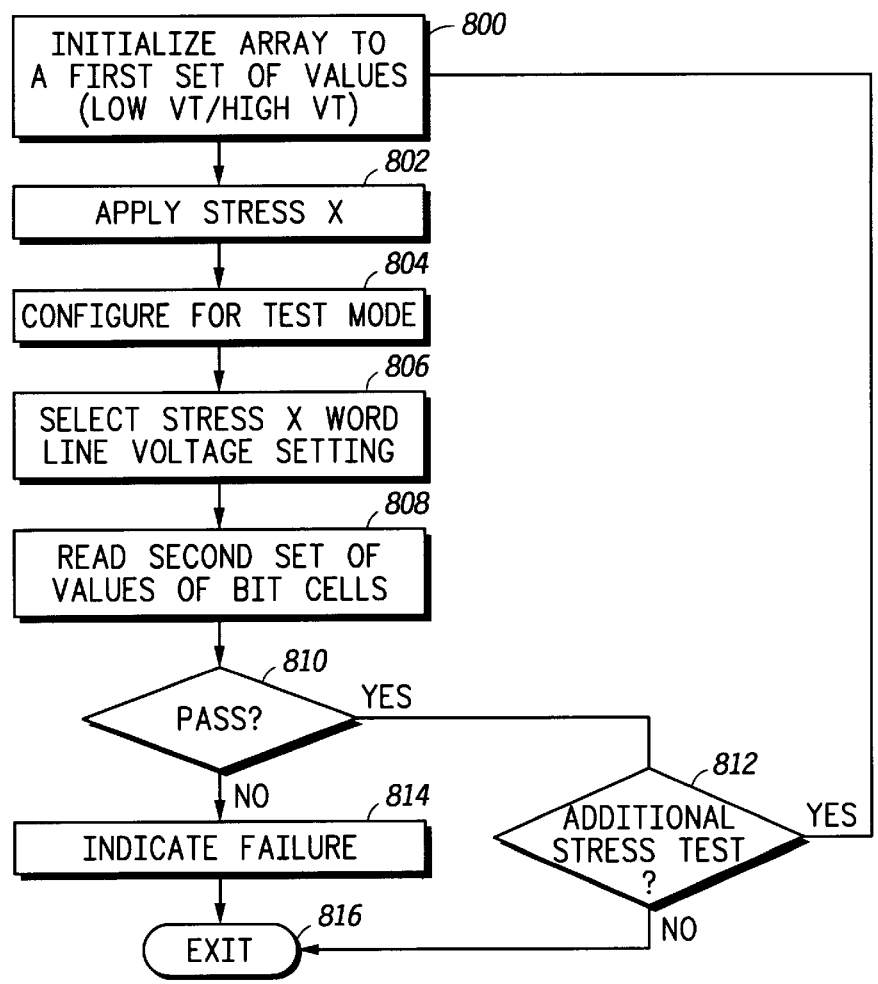
FIG. 8 is a flow chart showing the method according to the present invention for determining pass/fail criteria due to selected stress testing of the bit cells contained in the memory array.

FIG. 8 is a flow showing a method according to the present invention for determining pass/fail criteria due to selective stress testing of the bit cells contained in the non-volatile memory array. At block 800 the array of bit cells is initialized to a first set of values including, for example, a low $V_T$ and a high $V_T$. A stress is then applied to the array of bit cells of the NVM 110. The stress includes, for example, temperature acceleration stresses and voltage acceleration stresses or a combination of these stresses. At block 804 the NVM 110 is configured for test mode by selecting and applying the test power supply to the NVM 110. At block 806 a word line voltage is set to a stress margin voltage value. A second set of values is then read from the array of bit cells at block 808 after setting the word line voltage to the stress margin voltage value. The stress margin voltage value is selected in a range between a normal operating voltage value and a threshold state, either a low threshold state or a high threshold state. At decision block 810 the first set of values is compared to the second set of values to determine if a stress failure is indicated based on comparison of the first set of values to the second set of values providing a pass/fail criteria. If the NVM 110 does not pass the stress test, a failure is indicated at block 814 and the process exits at block 816. If the NVM 110 passes the stress test an additional stress test may be selected at decision block 812 wherein the process returns to block 800 and the NVM 110 array is initialized and a new stress is applied at block 802. At block 810 for example, a stress failure will be indicated at block 814 if, for example, the comparison of the first set of values and the second set of values indicates that the first set of values and the second set of values do not match. The method for determining a stress failure can also be applied to gang testing multiple devices on a wafer using the on-chip programmable circuitry of the present invention.

Figure 9:
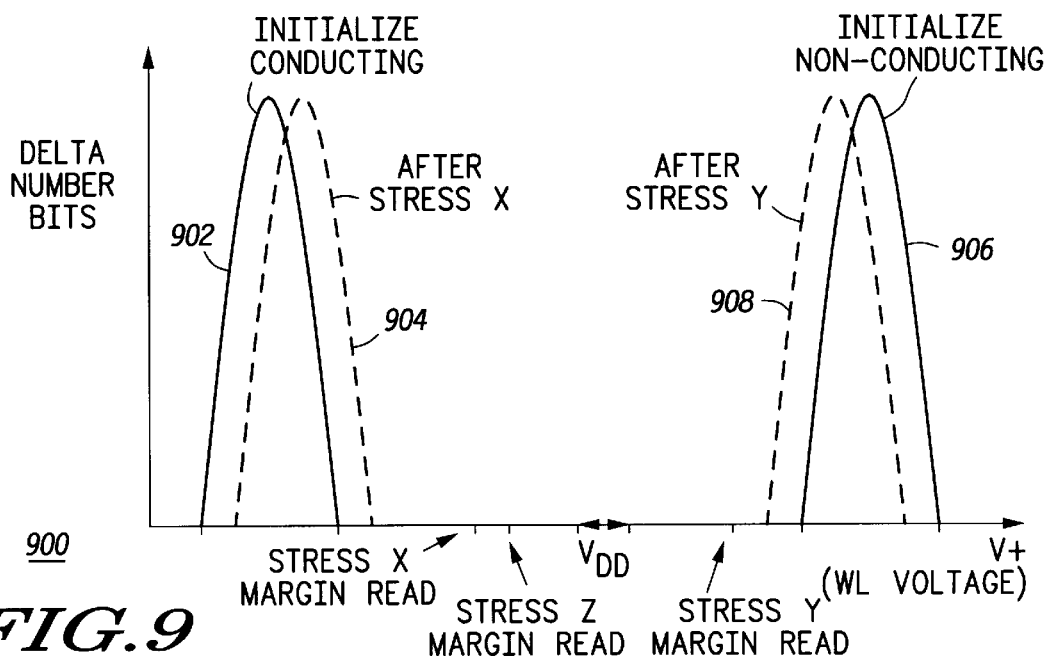
FIG. 9 is a diagram showing the distribution of the bit cells' $V_T$ with respect to word line voltages and indicating the failure levels for selected stress tests.

FIG. 9 is a diagram showing the distribution of the bit cells $V_T$ with respect to word line voltages and indicating the failure levels for selected stress tests. Bit cells in the initialized conducting state are shown residing in the distribution of curve 902. Stress margin reads for a stress X, a stress Y and a stress Z are also indicated on the word line voltage values. After a stress X is applied to the bit cells of the NVM 110 the bit cells are illustrated as residing in the distribution of curve 904. The data values of the bit cells should move in the manner expected and illustrated by distribution curve 904 or a failure is indicated for stress X. Bit cells initialized to a non-conducting or high $V_T$ reside in the distribution of curve 906 and after application of a stress Y should reside in the distribution of curve 908 or a stress failure is indicated for stress Y.

FIGS. 4, 6 and 8 depict flow charts of the operation of a module and method for operation and testing of the non-volatile memory module according to an embodiment of the invention. It is appreciated that operations discussed herein may consist of directly entered commands by a computer system user or by steps executed by application specific hardware modules, but the preferred embodiment includes steps executed by software modules. The functionality of steps referred to herein may correspond to the functionality of modules or portions of modules.

The operations referred to herein may be modules or portions of modules (e.g., software, firmware or hardware modules). For example, although the described embodiment includes software modules and/or includes manually entered user commands, the various exemplary modules may be application specific hardware modules. The software modules discussed herein may include script, batch or other executable files, or combinations and/or portions of such files. The software modules may include a program, or subroutines thereof, encoded on computer-readable media. For example, the present invention can include a computer program product encoded the computer readable media controlling access to the non-volatile memory. The computer program product includes first instructions, executable on a first data processing system, for selecting between the operational power supply node and the test power supply node wherein the test power supply node is on-chip programmable. Second instructions, which are executable on the first data processing system, operate the non-volatile memory in the operational mode if the operational power supply node is selected, and third instructions, which are executable on the first data processing system, operate the non-volatile memory in the test mode if the test power supply node is selected.

Additionally, those skilled in the art will recognize that the boundaries between modules are merely illustrative and alternative embodiments may merge modules or impose an alternative decomposition of functionality of modules. Moreover, alternative embodiments may combine multiple instances of a particular module or submodule. Furthermore, those skilled in the art will recognize that the operations described in exemplary embodiment are for illustration only. Operations may be combined or the functionality of the operations may be distributed in additional operations in accordance with the invention. Furthermore, those skilled in the art will recognize that circuit elements in circuit diagrams and boundaries between logic blocks are merely illustrative and that alternative embodiments may merge logic blocks or circuit elements or impose an alternate decomposition of functionality upon various logic blocks or circuit elements.

The above description is not intended to present an exhaustive list of embodiments of the invention. Although an attempt has been made to outline some exemplary embodiments and exemplary variations thereto, other embodiments and/or variations are within the scope of the invention as defined in the claims which follow.

What is claimed is:

1. A method of operating a non-volatile memory comprising an array of bit cells, the method comprising:

selecting between an operational power supply and a test power supply, the test power supply being on-chip programmable;

operating the non-volatile memory in an operational mode if the operational power supply is selected; and operating the non-volatile memory in a test mode if the test power supply is selected;

wherein in the test mode a threshold voltage distribution of the array of bit cells in the non-volatile memory is measured over a range of voltage values from a first voltage value to a last voltage value, wherein the voltage values comprise the first and last voltage values and a plurality of voltages between the first and last voltage values, and wherein operating the non-volatile memory in the test mode comprises:

selecting and applying the test power supply to the non-volatile memory;

setting a word line voltage to the first voltage value;

reading the array of bit cells in the non-volatile memory;

determining whether bit cells are conducting;
determining if the word line voltage has the last voltage value;
changing the word line voltage by a fraction of a value of the test power supply in the direction of the last voltage value if the word line voltage does not have the last voltage value; and
repeating the reading the array of bit cells, the determining whether bit cells are conducting, the determining if the word line voltage has the last voltage value, and the changing the word line voltage until the word line voltage has the last voltage value.

2. A method of operating a non-volatile memory comprising an array of bit cells, the method comprising:
selecting between an operational power supply and a test power supply, the test power supply being on-chip programmable;
operating the non-volatile memory in an operational mode if the operational power supply is selected; and
operating the non-volatile memory in a test mode if the test power supply is selected;
wherein in the test mode a threshold voltage distribution in the non-volatile memory is measured over a range of voltage values from a first voltage value to a last voltage value, and wherein operating the non-volatile memory in the test mode comprises:
selecting and applying the test power supply to the non-volatile memory;
setting a word line voltage to the first voltage value;
reading the array of bit cells in the non-volatile memory;
determining whether bit cells are conducting;
determining if the word line voltage has the last voltage value;
changing the word line voltage by a fraction of a value of the test power supply in the direction of the last voltage value if the word line voltage does not have the last voltage value; and
repeating the reading the array of bit cells, the determining whether bit cells are conducting, the determining if the word line voltage has the last voltage value, and the changing the word line voltage until the word line voltage has the last voltage value;
wherein setting the word line voltage to the first voltage value includes:
programming a control register with a first digital value indicative of the first voltage value; and
wherein changing the word line voltage includes;
changing the control register to a next digital value.

3. The method of claim 2, wherein changing the control register to a next digital value includes incrementing a field of the control register.

4. The method of claim 2, wherein changing the control register to a next digital value includes decrementing a field of the control register.

5. A method of operating a non-volatile memory comprising an array of bit cells, the method comprising:
selecting between an operational power supply and a test power supply, the test power supply being on-chip programmable;
operating the non-volatile memory in a operational mode if the operational power supply is selected; and
operating the non-volatile memory in a test mode if the test power supply is selected;
wherein in the test mode a threshold voltage distribution in the non-volatile memory is measured over a range of voltage values from a first voltage value to a last voltage value, and wherein operating the non-volatile memory in the test mode comprises:
selecting and applying the test power supply to the non-volatile memory;
setting a word line voltage to the first voltage value;
reading the array of bit cells in the non-volatile memory;
determining whether bit cells are conducting;
determining if the word line voltage has the last voltage value;
changing the word line voltage by a fraction of a value of the test power supply in the direction of the last voltage value if the word line voltage does not have the last voltage value; and
repeating the reading the array of bit cells, the determining whether bit cells are conducting, the determining if the word line voltage has the last voltage value, and the changing the word line voltage until the word line voltage has the last voltage value;
wherein determining whether bit cells are conducting comprises:
determining a number of bit cells which read as conducting for each word line voltage value.

6. A method of operating a non-volatile memory comprising an array of bit cells, the method comprising:
selecting between an operational power supply and a test power supply, the test power supply being on-chip programmable;
operating the non-volatile memory in a operational mode if the operational power supply is selected; and
operating the non-volatile memory in a test mode if the test power supply is selected:
wherein in the test mode a threshold voltage distribution in the non-volatile memory is measured over a range of voltage values from a first voltage value to a last voltage value, and wherein operating the non-volatile memory in the test mode comprises:
selecting and applying the test power supply to the non-volatile memory;
setting a word line voltage to the first voltage value;
reading the array of bit cells in the non-volatile memory;
determining whether bit cells are conducting;
determining if the word line voltage has the last voltage value;
changing the word line voltage by a fraction of a value of the test power supply in the direction of the last voltage value if the word line voltage does not have the last voltage value; and
repeating the reading the array of bit cells, the determining whether bit cells are conducting, the determining if the word line voltage has the last voltage value, and the changing the word line voltage until the word line voltage has the last voltage value;
wherein the determining whether bit cells are conducting comprises:
determining which bit cells read as conducting; and
storing the word line voltage value at which the bit cell first conducts for each bit cell which reads as conducting.

7. A method of operating a non-volatile memory comprising an array of bit cells, the method comprising:
selecting between an operational power supply and a test power supply, the test power supply being on-chip programmable;

operating the non-volatile memory in a operational mode if the operational power supply is selected; and operating the non-volatile memory in a test mode if the test power supply is selected;

wherein in the test mode imminent failure of the non-volatile memory is detected, and wherein operating the non-volatile memory in the test mode comprises:

selecting and applying the operational power supply to the non-volatile memory;

reading a first set of data from the array of bit cells after applying the operational power supply to the non-volatile memory;

selecting and applying the test power supply to the non-volatile memory;

setting a word line voltage to an imminent failure voltage value;

reading a second set of data from the array of bit cells after setting the word line voltage to the imminent failure voltage value;

comparing the first set of data to the second set of data; and determining if an imminent failure is indicated based on comparison of the first set of data to the second set of data.

8. The method of claim 7, wherein determining if an imminent failure is indicated further comprises:

indicating an imminent failure if the comparison of the first set of data and the second set of data indicates that the first set of data and the second set of data do not match.

9. The method of claim 7, wherein said imminent failure voltage value is an imminent failure high voltage value, and wherein the method further comprises:

setting the word line voltage to an imminent failure low voltage value;

reading a third set of data from the array of bit cells after setting the word line voltage to the imminent failure low voltage value;

comparing the first set of data and the third set of data; and determining if an imminent failure is indicated based on comparison of the first set of data to the third set of data.

10. The method of claim 9, wherein said imminent failure voltage value is an imminent failure low voltage value, and wherein the method further comprises:

setting the word line voltage to an imminent failure high voltage value;

reading a third set of data from the array of bit cells after setting the word line voltage to the imminent failure high voltage value;

comparing the first set of data and the third set of data; and determining if an imminent failure is indicated based on comparison of the first set of data to the third set of data.

11. The method of claim 7, wherein the first set of data includes a checksum of first values read from the array of bit cells after applying the operational power supply to the non-volatile memory; and the second set of data includes a checksum of second values from the array of bit cells after setting the word line voltage to the imminent failure voltage value.

12. The method of claim 9, wherein the third set of data includes a checksum of third values read from the array of bit cells after setting the word line voltage to the imminent failure low voltage value.

13. The method of claim 10, wherein the third set of data includes a checksum of third values read from the array of bit cells after setting the word line voltage to the imminent failure high voltage value.

14. A method of operating a non-volatile memory comprising an array of bit cells, the method comprising:

selecting between an operational power supply and a test power supply, the test power supply being on-chip programmable;

operating the non-volatile memory in a operational mode if the operational power supply is selected; and operating the non-volatile memory in a test mode if the test power supply is selected;

wherein in the test mode the non-volatile memory is stress tested, and wherein operating the non-volatile memory in the test mode comprises:

initializing the array of bit cells to a first set of values;

applying a stress voltage;

selecting and applying the test power supply to the non-volatile memory;

setting a word line voltage to a stress margin voltage value;

reading a second set of values from the array of bit cells after setting the word line voltage to the stress margin voltage value;

comparing the first set of values to the second set of values; and determining if a stress failure occurs based on comparison of the first set of values to the second set of values.

15. The method of claim 14, wherein determining if a stress failure occurs further comprises:

indicating a stress failure if the comparison of the first set of values and the second set of values indicates that the first set of values and the second set of values do not match.

16. The method of claim 14, wherein the stress is at least one of the group consisting of:

temperature acceleration stress; and voltage acceleration stress.

17. The method of claim 14, wherein the stress margin voltage value is in a range between a normal operating voltage value and a low threshold state.

18. The method of claim 14, wherein the stress margin voltage value is in a range between a normal operating voltage value and a high threshold state.

19. A non-volatile memory integrated circuit comprising:

an array of bit cells, each bit cell referenced by a word line and a bit line;

a power supply switch having an output coupled to provide power to the array of bit cells, the power supply switch selecting between one of an on-chip programmable test power supply node and an operational power supply node;

a programmable voltage generator coupled to the on-chip programmable test power supply node; and a control circuit coupled to the programmable voltage generator for determining the voltage output by the programmable voltage generator.

20. The non-volatile memory integrated circuit of claim 19 wherein the programmable voltage generator comprises a voltage divider; and the programmable voltage generator has an input coupled to a voltage supply node.

21. The non-volatile memory integrated circuit of claim 19 wherein the power supply switch output is coupled to provide a voltage value to a word line of the non-volatile memory.

22. A microcontroller comprising:

a array of non-volatile memory bit cells;

a power switch having an output coupled to the array;

a programmable voltage generator having an output coupled to provide a test voltage to a first input of the power switch;

an operational power source having an output coupled to a second input of the power switch; and a control circuit having an first output coupled to a control input of the power switch and having a second output coupled to the programmable voltage generator for determining the test voltage output by the programmable voltage generator.

23. A method of gang testing multiple devices on a wafer using on-chip programmable circuitry, each device including a non-volatile memory having an array of bit cells, the method comprising:

initializing the array of bit cells to a first set of values;

applying a stress voltage;

selecting and applying a test power supply to the non-volatile memory, the test power supply being on-chip programmable;

setting a word line voltage to a stress margin voltage value;

reading a second set of values from the array of bit cells after setting the word line voltage to the stress margin voltage value;

comparing the first set of values to the second set of values; and determining if a stress failure occurs based on comparison of the first set of values to the second set of values.

24. A method of gang testing multiple devices on a wafer using on-chip programmable circuitry, each device including a non-volatile memory having an array of bit cells, the method comprising:

selecting and applying a test power supply to the non-volatile memory, the test power supply being on-chip programmable;

setting a word line voltage to a first voltage value of a plurality of voltage values comprising the first voltage value, a last voltage value, and a plurality of voltages between the first and last voltage values;

reading the array of bit cells in the non-volatile memory;

determining whether bit cells are conducting;

determining if the word line voltage has a last voltage value;

changing the word line by a fraction of a value of the test power supply to a selected one of the plurality of voltage values which is next in the direction of the last voltage value if the word line voltage does not have the last voltage value; and repeating the reading the array of bit cells, the determining whether bit cells are conducting, the determining if the word line voltage has the last voltage value, and the changing the word line voltage until the word line voltage has the last voltage value; and wherein a threshold voltage distribution in the non-volatile memory is measured over a range from the first voltage value to the last voltage value.

* * * * *